(12) United States Patent
Lim et al.

(10) Patent No.: US 9,253,933 B2
(45) Date of Patent: Feb. 2, 2016

(54) ELECTRIC PROPULSION SYSTEM OF ELECTRIC VEHICLE

(71) Applicants: Jong Kwang Lim, Daejeon (KR); Yoon Bok Lee, Daejeon (KR); Won Seok Kang, Daejeon (KR)

(72) Inventors: Jong Kwang Lim, Daejeon (KR); Yoon Bok Lee, Daejeon (KR); Won Seok Kang, Daejeon (KR)

(73) Assignee: Agency for Defense Development, Daejeon (KR)

( * ) Notice: Subject to any disclaimer, the term of this patent is extended or adjusted under 35 U.S.C. 154(b) by 139 days.

(21) Appl. No.: 14/249,453

(22) Filed: Apr. 10, 2014

(65) Prior Publication Data
US 2015/0077964 A1 Mar. 19, 2015

(30) Foreign Application Priority Data
Sep. 13, 2013 (KR) .................. 10-2013-0110243

(51) Int. Cl.
*G06F 1/16* (2006.01)
*H05K 9/00* (2006.01)
(Continued)

(52) U.S. Cl.
CPC .......... *H05K 9/0007* (2013.01); *B60L 11/1879* (2013.01); *B60L 15/007* (2013.01);
(Continued)

(58) Field of Classification Search
CPC .................. G06F 1/16; G06F 1/1601–1/1611; G06F 1/1613–1/1698; G06F 1/18–1/189; H05K 5/00–5/069; H05K 7/00–7/186
USPC ............. 361/679.01–679.45, 679.55–679.61, 361/724–730, 679.26–679.3, 361/679.55–679.56, 679.31–679.39, 741, 361/748–752, 756, 686, 687, 688, 696, 697, 361/787, 789, 794, 701–703, 709, 361/807–818; 455/575.1–575.9; 349/56–60; 312/223.1–223.3
See application file for complete search history.

(56) References Cited

U.S. PATENT DOCUMENTS 6,115,236 A * 9/2000 Jedlitschka ........... H02M 7/106
174/50
6,313,992 B1 * 11/2001 Hildebrandt .......... H01L 23/427
165/104.34
(Continued)

FOREIGN PATENT DOCUMENTS

JP 2007-282370 A 10/2007
JP 2011-222398 A 11/2011
(Continued)

OTHER PUBLICATIONS

English Abstract of JP 2005-229708 A, dated Aug. 25, 2005.

*Primary Examiner* — Anthony Haughton
*Assistant Examiner* — Razmeen Gafur
(74) *Attorney, Agent, or Firm* — Scully, Scott, Murphy & Presser, P.C.

(57) ABSTRACT

An electric propulsion system of an electric vehicle according to one exemplary embodiment of the present disclosure includes a housing having an inside partitioned into a plurality of spaces, power conversion devices disposed in the partitioned spaces of the housing, respectively, a connection bar formed on one surface of the housing to electrically interconnect the power conversion devices and a battery, and adapters configured to connect the connection bar to the power conversion devices, wherein each of the adaptors comprises an inner side and an outer side, wherein the inner side of the adaptor is provided with conductor members formed to be electrically connected to electrodes of the power conversion devices when the electrodes are inserted therein, wherein the outer side of the adaptor is provided with shielding members covering the conductor members for shielding noise generated from the power conversion devices.

9 Claims, 20 Drawing Sheets

(51) Int. Cl.
  *B60L 11/18* (2006.01)
  *B60L 15/00* (2006.01)
  *B60R 16/033* (2006.01)
  *H05K 5/00* (2006.01)
  *H05K 7/00* (2006.01)
  *H02M 7/00* (2006.01)
  *H02M 1/00* (2007.01)

(52) U.S. Cl.
  CPC .......... *B60R 16/033* (2013.01); *B60L 2210/10* (2013.01); *B60L 2210/30* (2013.01); *B60L 2210/40* (2013.01); *H02M 7/003* (2013.01); *H02M 2001/008* (2013.01); *Y02T 10/7005* (2013.01); *Y02T 10/705* (2013.01); *Y02T 10/7216* (2013.01); *Y02T 10/7241* (2013.01)

(56) References Cited

U.S. PATENT DOCUMENTS

| | | | | |
|---|---|---|---|---|
| 6,488,517 | B1* | 12/2002 | Williams | G06F 1/1616 361/679.28 |
| 8,564,953 | B2* | 10/2013 | Horiuchi | H01L 23/473 257/707 |
| 8,659,130 | B2* | 2/2014 | Takagi | H01L 23/3675 257/675 |
| 8,963,322 | B2* | 2/2015 | Kiuchi | H01L 23/4012 257/686 |
| 2003/0057705 | A1* | 3/2003 | Kusumi | B60L 11/14 290/40 C |
| 2004/0022041 | A1* | 2/2004 | Bergmann | H02M 7/003 361/784 |
| 2006/0146504 | A1* | 7/2006 | Belson | G06F 1/189 361/728 |
| 2006/0232942 | A1* | 10/2006 | Nakatsu | B60L 11/08 361/710 |
| 2007/0002594 | A1* | 1/2007 | Otsuka | H02M 7/003 363/37 |
| 2007/0258219 | A1* | 11/2007 | Howes | H05K 7/1432 361/728 |
| 2009/0095979 | A1* | 4/2009 | Saito | H01L 25/18 257/177 |
| 2009/0244854 | A1* | 10/2009 | Hattori | H02K 11/0073 361/736 |
| 2010/0128437 | A1* | 5/2010 | Groppo | H05K 7/20927 361/703 |
| 2010/0165582 | A1* | 7/2010 | Hornkamp | H01L 23/053 361/740 |
| 2010/0181877 | A1* | 7/2010 | Watanabe | F04B 27/0895 310/68 D |
| 2011/0095659 | A1* | 4/2011 | Hattori | F04B 39/121 310/68 D |
| 2011/0194250 | A1* | 8/2011 | Perkins, III | H05K 7/1434 361/690 |
| 2012/0244730 | A1* | 9/2012 | Grimm | H01R 13/447 439/142 |
| 2012/0320545 | A1* | 12/2012 | Lo Presti | H05K 1/145 361/752 |
| 2013/0154081 | A1* | 6/2013 | Kadoguchi | H01L 23/36 257/712 |

FOREIGN PATENT DOCUMENTS

| | | |
|---|---|---|
| KR | 10-2006-0041625 A | 5/2006 |
| KR | 10-2008-0057567 A | 6/2008 |

* cited by examiner

ELECTRIC PROPULSION SYSTEM OF ELECTRIC VEHICLE

CROSS-REFERENCE TO RELATED APPLICATION

Pursuant to 35 U.S.C. §119(a), this application claims the benefit of earlier filing date and right of priority to Korean Application No. 10-2013-0110243, filed on Sep. 13, 2013, the contents of which is incorporated by reference herein in its entirety.

BACKGROUND OF THE DISCLOSURE

1. Field of the Disclosure

This specification relates to an electric propulsion system of an electric vehicle, capable of reducing and shielding electromagnetic noise, generated in an electric vehicle using high power, and stabilizing a voltage variation (fluctuation) of DC high-voltage.

2. Background of the Disclosure

Electric vehicles, such as hybrid vehicles or electric propulsion vehicles which are driven by an electric motor, use a high-voltage high-current electric propulsion system (using a DC voltage of 340V to 1000V and a current of 80 A to 300 A). The high-voltage high-current electric propulsion system is configured by including high-power conversion devices, such as an electric generator, a motor, an AC-DC inverter and a DC-DC converter. However, the high power conversion devices are large in size so as to be disposed within a narrow space of the vehicle in a distributing manner.

Specifically, in the aspect that a human and low-voltage electric and electronic devices are present in a high-voltage noise environment formed within a narrow space of the electric vehicle, high-voltage electromagnetic noise may be likely to affect the human body and cause erroneous operations of the electric and electronic devices. While the electric propulsion system is operating, various digital or analog circuits, communication circuits and the like, which use a low voltage below 28V, may be affected by the high-voltage electromagnetic noise. This may cause erroneous operations of various controllers of the vehicle and accordingly bring about an accident of the vehicle. Also, a communication fault (or failure) may be caused in various communication devices mounted in the vehicle, due to electromagnetic noise interference. Actually, a radio, a cellular phone, and other radio devices, whose usage frequency bands overlap a frequency band of the high-voltage noise, may be confronted with degradation of reception sensitivity, and a communication failure of a controller area network (CAN) of a high-voltage battery management system (BMS) may be caused. Consequently, a safety accident may be likely to happen during the travel of the vehicle. Therefore, an electric propulsion system should be designed and fabricated in such a way of preventing the electromagnetic noise or avoid an affection thereby.

An electromagnetic noise generation source in the electric propulsion system is an insulated gate bipolar transistor (IGBT), which is a high-power switching element mounted in an AC-DC inverter, a DC-DC converter and the like. Along a propagation path of high-power switching noise generated from the IGBT may be compositively generated conducted noise due to a leakage current, which is generated from a high-power conversion device, a high-power cable, an electric generator and a motor so as to flow along conductors of a vehicle, and complex radiation noise radiated from a high-voltage power line and the high-power conversion device.

For a 200 kW electric vehicle, more than eight high-power components are interconnected via high-voltage cables. One strand of a high-voltage DC-power cable may be more than 10 mm thick, and the number of power line cables may be totally 16. Also, each power cable may be 1 m to 7 m long. High-voltage 3-phase AC cables of the electric generator and the motor may be more than 10 mm thick and about 5 m long. The AC cables may serve as a propagation path of the electromagnetic noise generated from the IGBT. As the power transfer path extends, the electromagnetic noise may increase and thereby the electric and electronic devices near the power lines may be affected by the electromagnetic waves. Thus, a method of minimizing the electromagnetic noise may be taken into consideration.

SUMMARY OF THE DISCLOSURE

Therefore, an aspect of the detailed description is to provide an electric propulsion system of an electric vehicle, capable of reducing electromagnetic interference due to electromagnetic noise.

To achieve these and other advantages and in accordance with the purpose of this specification, as embodied and broadly described herein, there is provided an electric propulsion system of an electric vehicle, including a housing having an inside partitioned into a plurality of spaces, power conversion devices disposed in the partitioned spaces of the housing, respectively, a connection bar formed on one surface of the housing to electrically interconnect the power conversion devices and a battery, and adapters configured to connect the connection bar to the power conversion devices. Here, each of the adaptors may include an inner side and an outer side. The inner side of the adaptor may be provided with conductor members formed to be electrically connected to electrodes of the power conversion devices when the electrodes are inserted therein. The outer side of the adaptor may be provided with shielding members covering the conductor members for shielding noise generated from the power conversion devices.

In accordance with one exemplary embodiment disclosed herein, each of the adaptors may have one side coupled to the connection bar, and the other side detachably coupled to the electrodes of the power conversion devices.

In accordance with one exemplary embodiment disclosed herein, each of the adaptors may include a knob formed to be rotatable, and the conductor members and the electrodes may come in contact with each other or be separated from each other in response to a rotation of the knob.

In accordance with one exemplary embodiment disclosed herein, each of the power conversion devices may include a high-voltage circuit unit and a low-voltage circuit unit. The high-voltage circuit unit and the low-voltage circuit unit may be covered with shielding cases, respectively, and spaced from each other within each space.

In accordance with one exemplary embodiment disclosed herein, the system may further include a heat sink covering one surface of the high-voltage circuit unit. The high-voltage circuit unit may include an insulated gate bipolar transistor (IGBT) as a switching element. An emitter terminal of the IGBT may be connected to a copperplate formed between the IGBT and the heat sink.

In accordance with one exemplary embodiment disclosed herein, one surface of the high-voltage circuit unit and one surface of the low-voltage circuit unit may be orthogonal to each other.

In accordance with one exemplary embodiment disclosed herein, a pipe connecting portion may be formed through the housing to supply cooling fluid into an inner space of the housing. A pipe connector coupled to the pipe connecting portion may shield a hole of the housing having the pipe connecting portion.

In accordance with one exemplary embodiment disclosed herein, the battery and the connection bar may be connected to each other with interposing an impedance adjusting unit therebetween. A direct-current (DC) connector may be formed through one side of the housing having the impedance adjusting unit. The DC connector may include electrode members having electrodes exposed on inner circumferences thereof, insulators covering outer circumferences of the electrode members, and shielding portions shielding the insulators.

In accordance with one exemplary embodiment disclosed herein, a three-phase alternating-current (AC) connector may be formed through one side of the housing having the power conversion device with an inverter. The three-phase AC connector may include electrode members having electrodes exposed on inner circumferences thereof, insulators covering outer circumferences of the electrode members, and shielding portions shielding the insulators.

In accordance with one exemplary embodiment disclosed herein, the housing may include first cases covering the power conversion devices, respectively, and a second case covering the first cases. The connection bar may be integrally formed with the second case.

In an electric propulsion system of an electric vehicle in accordance with at least one exemplary embodiment disclosed herein, when power conversion devices which generate high-power switching noise are coupled into a housing which shields electromagnetic noise, a double-shielding structure may be realized and conduced noise can be discharged to the ground of the vehicle through the housing shielding the electromagnetic noise. This may allow for overcoming high-voltage electromagnetic interference in the electric vehicle, thereby ensuring safety while the vehicle is traveling and preventing malfunctions of devices using frequencies.

Also, the high-power conversion devices can be connected by use of adapters shielding electromagnetic noise, without use of high-voltage cables. Accordingly, an increase in maintainability and safety from high voltage can be obtained and those power conversion devices can be arranged within a narrow space of the vehicle in a distributing manner according to sizes thereof.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE DISCLOSURE

Description will now be given in detail of an electric propulsion system of electric vehicle according to the exemplary embodiments, with reference to the accompanying drawings. Hereinafter, suffixes "module" and "unit or portion" for components used herein in description are merely provided only for facilitation of preparing this specification, and thus they are not granted a specific meaning or function. Hence, it should be noticed that "module" and "unit or portion" can be used together. For the sake of brief description with reference to the drawings, the same or equivalent components will be provided with the same reference numbers, and description thereof will not be repeated. The expression in the singular form in this specification will cover the expression in the plural form unless otherwise indicated obviously from the context.

Figure 1A:
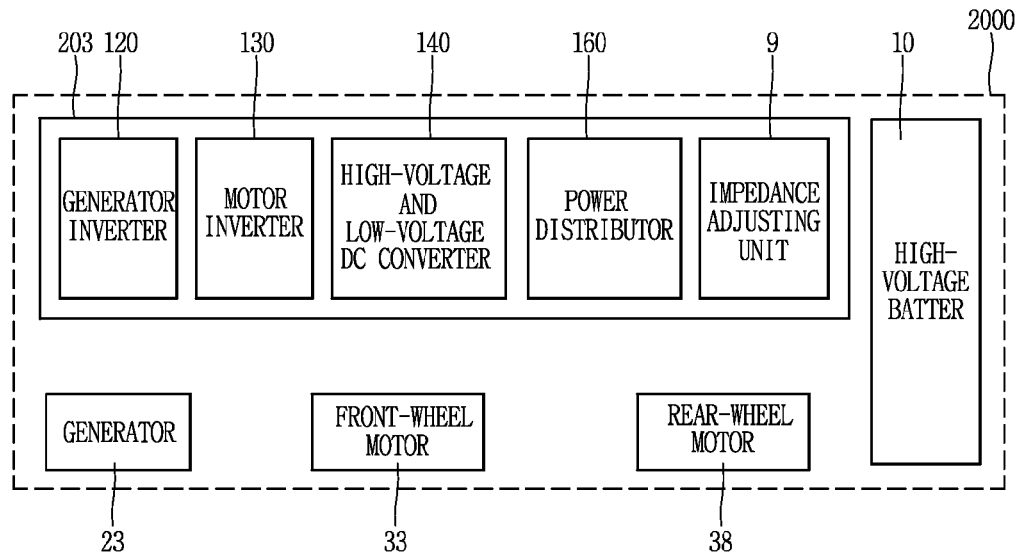
FIG. 1A is a conceptual view of an electric vehicle in accordance with one exemplary embodiment disclosed herein.
Figure 1B:
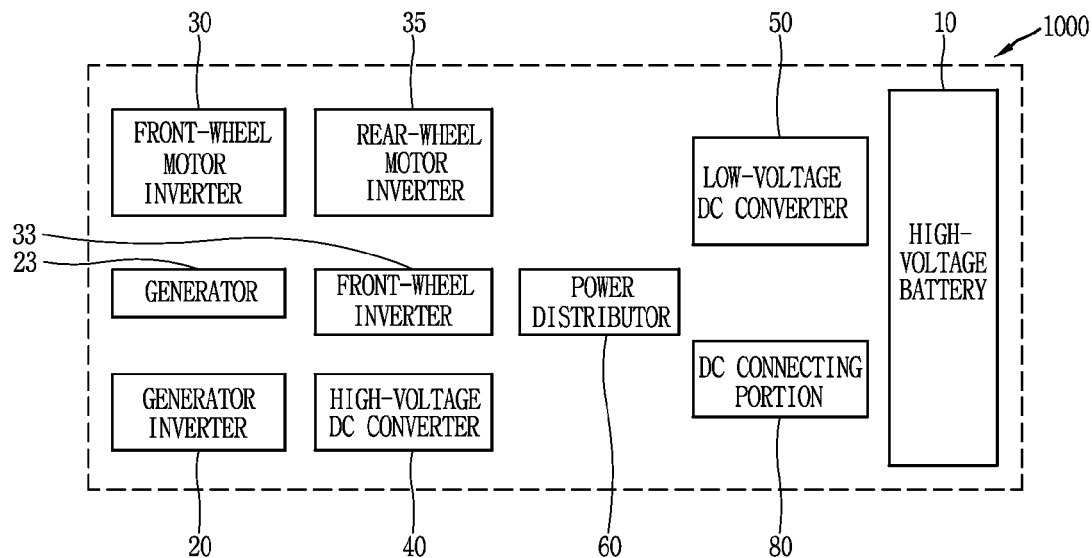
FIG. 1B is a conceptual view of an electric vehicle in accordance with a comparative embodiment.
Figure 2:
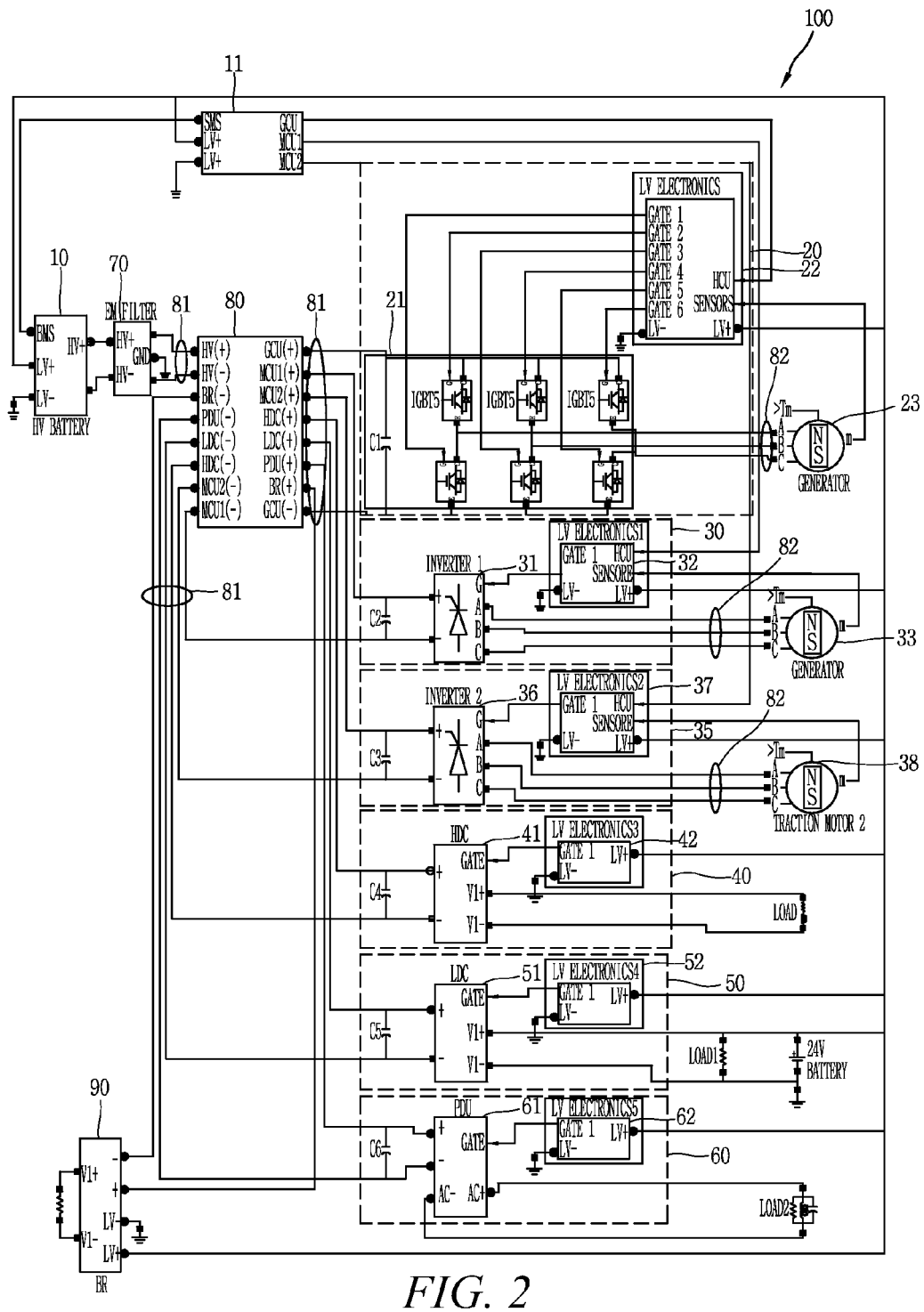
FIG. 2 is a view illustrating an electric circuit of an electric propulsion system mounted to the electric vehicle of FIG. 1B.

FIG. 1A is a conceptual view of an electric vehicle in accordance with one exemplary embodiment disclosed herein, FIG. 1B is a conceptual view of an electric vehicle in accordance with an comparative embodiment, and FIG. 2 is a view illustrating an electric circuit of an electric propulsion system mounted to the electric vehicle of FIG. 1B.

As illustrated in FIGS. 1B and 2, an electric propulsion system 100 according to a comparative embodiment may include a high-voltage battery 10, an electric generator (or a generator) 23, a generator inverter 20, a front-wheel motor 33, a rear-wheel motor 38, a front-wheel motor inverter 30, a rear-wheel motor inverter 35, a high-voltage DC converter 40, a low-voltage DC converter 50, a power distributor 60, an electromagnetic interference (EMI) filter 70, a DC connecting portion 80, a braking resistor 90 and a controller 11.

The high-voltage battery 10 may store power generated from the electric generator 23 as much as being instructed by the controller 11, and supply the stored power if necessary.

The generator inverter 20 may generate power by controlling the electric generator 23 according to a command of the controller 11.

The front-wheel motor inverter 30 and the rear-wheel motor inverter 35 may drive the front-wheel motor 33 and the rear-wheel motor 38, respectively, according to the command of the controller 11, such that an electric vehicle 1000 can travel.

The high-voltage DC converter 40 is a device for converting a DC voltage in the range of 680V to 1000V into a DC voltage of 340V. The high-voltage DC converter 40 may supply power to an electric device, such as an air conditioner.

The low-voltage DC converter 50 may convert a DC voltage in the range of 680V to 1000V into a DC voltage of 28V. The low-voltage DC converter 50 may recharge a low-voltage battery of 24V and supply power with respect to a low-voltage electric device.

The power distributor 60 may convert a DC voltage in the range of 680V to 1000V into an AC voltage to supply power with respect to mission equipment, such as a communication device.

The EMI filter 70 may be an electromagnetic noise filter, which is connected to the high-voltage battery 10, which is connected with the DC connecting portion 80. The EMI filter 70 may thus prevent a malfunction (or an erroneous operation) of the high-voltage battery 10 due to electromagnetic noise which is propagated by being generated from the electric generator 23, the generator inverter 20, the front-wheel motor 33, the rear-wheel motor 38, the front-wheel motor inverter 30, the rear-wheel motor inverter 35, the high-voltage DC converter 40, the low-voltage DC converter 50, the power distributor 60 and the like.

The DC connecting portion 80 may be formed to supply high-voltage high-current power from the high-voltage battery 10 to the generator inverter 20, the front-wheel motor inverter 30, the rear-wheel motor inverter 35, the high-voltage DC converter 40, the low-voltage DC converter 50, the power distributor 60 and the like.

The braking resistor 90 is a protection device by which a surge current generated due to an overvoltage is consumed by being converted into heat when a counter electromotive force generated from the electric generator 23, the front-wheel motor 33 and the rear-wheel motor 38 is greater than internal pressure set for the generator inverter 20, the front-wheel motor inverter 30 and the rear-wheel motor inverter 35.

The controller 11 may monitor statuses of the high-voltage battery 10, the generator inverter 20, the front-wheel motor inverter 30, the rear-wheel motor inverter 35, the high-voltage DC converter 40, the low-voltage DC converter 50, the power distributor 60 and the like, and control power therefor.

Referring to FIG. 2, the generator inverter 20, the front-wheel motor inverter 30, the rear-wheel motor inverter 35, the high-voltage DC converter 40, the low-voltage DC converter 50, the power distributor 60 and the braking resistor 90, which are disposed within the electric vehicle 1000, may be connected to the DC connecting portion 80 via high-voltage DC cables, which are more than 10 mm thick and about 2 m to 6 m long.

The electric generator 23, the front-wheel motor 33 and the rear-wheel motor 38 may be connected to 3-phase AC connectors, respectively, via cables each of which is several meters long. Accordingly, a user located in the electric vehicle 1000 and the low-voltage electric devices may be likely to be affected due to electromagnetic waves, which are generated and propagated through the power conversion devices 20, 30, 35, 40, 50, 60 and 90 disposed within the electric vehicle 1000 and the high-voltage DC and AC cables which are several meters long.

Figure 3:
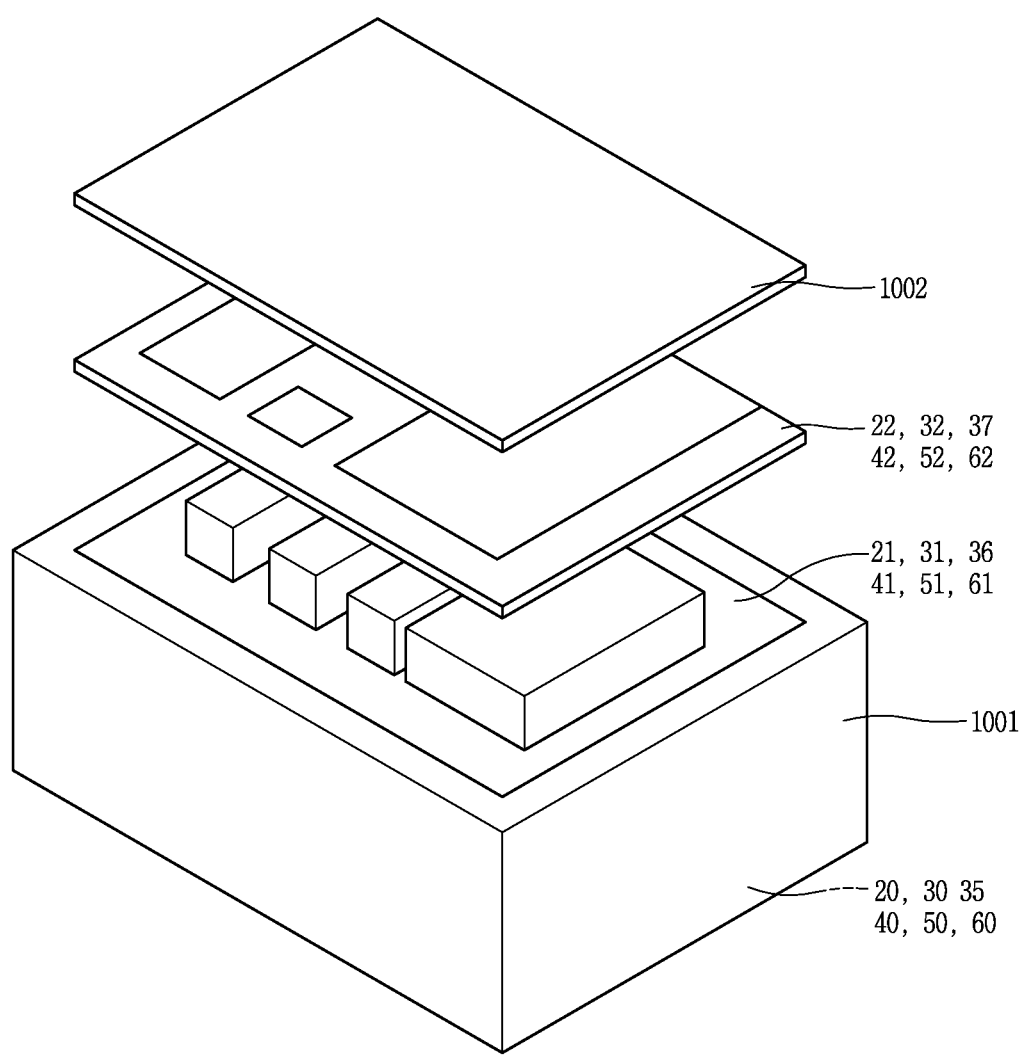
FIG. 3 is a view illustrating an internal structure of a power conversion device illustrated in FIG. 1B, which illustrates that a high-voltage circuit unit and a low-voltage circuit unit are mounted in a housing without being shielded.

FIG. 3 is a view illustrating an internal structure of the power conversion devices illustrated in FIG. 1B, which illustrates that a high-voltage circuit unit and a low-voltage circuit unit are mounted in a housing without being shielded.

Still referring to FIG. 1B, a housing of the power conversion devices may be provided with a housing main body 1001, and a housing cover 1002.

As illustrated in FIG. 3, with regard to the generator inverter 20, the front-wheel motor inverter 30, the rear-wheel motor inverter 35, the high-voltage DC converter 40, the low-voltage DC converter 50 and the power distributor 60, a high-voltage circuit unit 21, 31, 36, 41, 51, 61 may be disposed within a narrow space along with a low-voltage circuit unit 22, 32, 37, 42, 52, 62, which may be affected by electromagnetic interference.

The electric propulsion system may cause the following problems in the electric vehicle 1000 which exhibits an output over 200 kW, specifically, in relation electromagnetic noise. First, since components of the high-voltage high-current electric propulsion system and the cables are distributed in the narrow space of the vehicle, the components of the electric propulsion system may cause the electromagnetic interference with the low-voltage components therearound. Also, since the high-voltage DC power cables and the high-voltage 3-phase AC cables of the generator and the motors are too long and distributed in the narrow space of the vehicle, the number of electromagnetic interference paths may increase. This may result in increased possibility of the electromagnetic interference.

Second, if a shielding effectiveness of the high-power conversion devices, the high-power cables and the connector is unsatisfactory, low-voltage circuits may be disposed adjacent to high-voltage circuits, without being shielded, within the narrow space of the high-power conversion devices. Accordingly, the low-voltage circuits, such as CAN communication circuits, digital circuits and analog circuits, may not be free from the electromagnetic interference due to the high voltage. In addition, high-voltage noise may be leaked through incompletely-shielded minute spaces of the high-power cables and the connector.

Lastly, there may be a problem in impedance matching between an input capacitor of the power conversion device and a cable. As the high-power cable extends in length, line impedance may increase. This may cause a drastic change in loads and increase a DC voltage fluctuation (or DC voltage variation) accordingly. The voltage fluctuation may bring about an unstable high-speed switching operation of the IGBT. Further, an electromagnetic wave generating cause may increase due to a fluctuation (variation) of an IGBT switching current which flows into loads such as a generator, a motor, an air conditioner and the like connected to an output end of the IGBT. When an input capacitor of a predetermined power conversion device is mounted in a vehicle, it may have a parallel connection structure with other power conversion devices and the high-power cables which are long in length. Accordingly, since the parallel-connected line impedances from the high-voltage battery to each power conversion device have several times of differences, the variation of power supplied from the high-voltage battery and the generator to each power conversion device may increase and the variation (fluctuation) of a DC input voltage of each power conversion device may also increase at a high-torque driving of the vehicle.

Those problems, specifically, may result from the current variation and the voltage variation due to the difference of line impedances which are unbalanced when switching noise generated from the IGBT used as the switching element is propagating along the cables with different lengths. Hereinafter, description will thusly be given a method of minimizing the current variation and the voltage variation on circuits of the electric propulsion system, which mainly cause an electromagnetic interference, and minimizing or blocking an electromagnetic interference path on a propagation path of electromagnetic noise generated from the IGBT, in the following embodiments with reference to the drawings.

Figure 4:
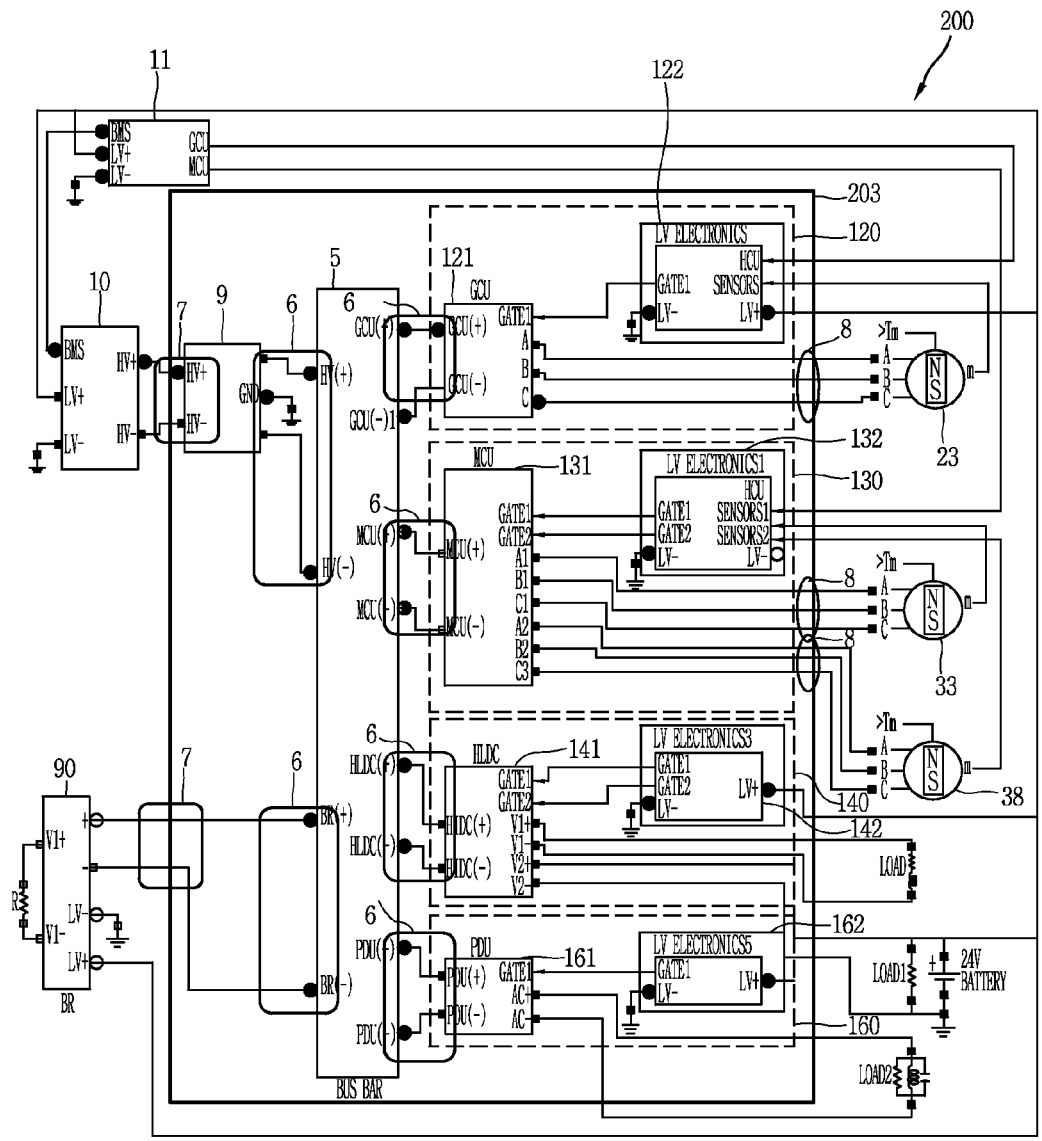
FIG. 4 is a circuitry view of an electric propulsion system with a housing mounted thereto to shield electromagnetic noise in accordance with one exemplary embodiment disclosed herein.
Figure 5:
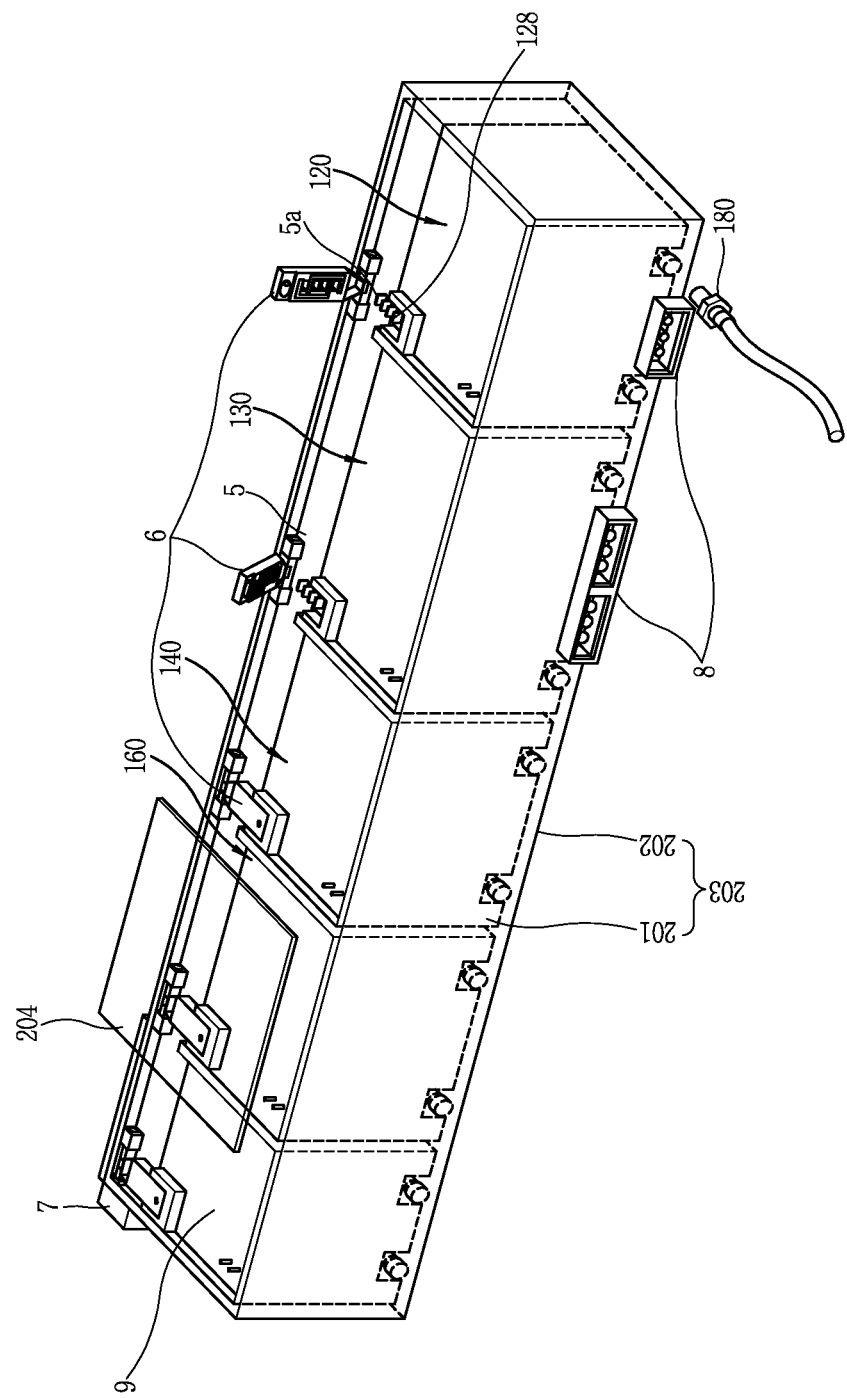
FIG. 5 is an exploded view of a housing for shielding electromagnetic noise in accordance with one exemplary embodiment disclosed herein.

FIG. 4 is a circuitry view of an electric propulsion system with a housing mounted thereto to block electromagnetic noise in accordance with one exemplary embodiment disclosed herein, and FIG. 5 is an exploded view of the housing for blocking the electromagnetic noise in accordance with the one exemplary embodiment disclosed herein.

Referring to FIGS. 4 and 5 together with FIG. 1A, an electric propulsion system 2000 may include a housing 203, power conversion devices 120, 130, 140 and 160, a connection bar 5, and adapters 6. The electric propulsion system 2000 may further include a braking resistor 90 and a controller 11.

The housing 203 may have an inside partitioned into a plurality of spaces. The power conversion devices may be independently disposed in the respectively partitioned spaces of the housing 203. Examples of the power conversion devices may include the generator inverter, the motor inverter, the high-voltage DC converter, the low-voltage DC converter, the power distributor and the like, which have been described in the foregoing comparative embodiment.

The motor inverter 130 may control the front-wheel motor 33 and the rear-wheel motor 38 in an independent manner within one integrated housing.

The power conversion devices constructing the electric propulsion system 2000 are the same as or similar to those illustrated in the comparative embodiment, so detailed description thereof will be omitted.

Each of the power conversion devices may include a high-voltage circuit unit 121, 131, 141, 161 and a low-voltage circuit unit 122, 132, 142, 162. The high-voltage circuit unit and the low-voltage circuit unit, as will be explained later, may be disposed in an inner space 205 to be illustrated in FIG. 7A, and covered with shielding cases 121b and 122b (see FIGS. 7B and 7C).

The housing 203 may include first cases 201 for covering the power conversion devices, respectively, and a second case 202 for covering the first cases 201. After the first cases 201 are coupled to the second case 202, covers 204 of the second case 202 may shield the first cases 201 and the power conversion devices. Unlike this, the second case 202 may be partitioned into a plurality of spaces and the first case 201 may be disposed in each space. Here, the high-voltage portion 121 of each of the power conversion devices may be located in the first case and a low-voltage portion 122 thereof may be located outside the second case.

Each of the power conversion devices may be double-shielded by the first and second cases 201 and 202. The high-voltage circuit unit and the low-voltage circuit unit may be triple-shielded by the shielding cases 121b and 122b (see FIGS. 7B and 7C) and the first and second cases 201 and 202. The shielding cases 121b and 122b and the first and second cases 201 and 202 may be formed of a metal, and processed by a stage-based molding operation in a pressing manner. Also, those cases may be formed of synthetic resin. Here, one surface of each of the cases may be covered with a metal or may be plated.

A high-voltage DC electrode portion, a high-voltage 3-phase AC electrode portion, a bus bar, an adapter portion may be covered with a separate case, which is fabricated independent of the second case.

The connection bar 5 may be configured to electrically interconnect at least two power conversion devices. The connection bar 5 may replace power cables. An example of the connection bar 5 may include a bus bar. The bus bar may be formed in a shape of a long metallic plate. Owing to the wide plate shape as compared to the cable, the bus bar may arouse a high radiation effect and a large surface area. This may result in lowering of impedance of a high frequency current flowing on a surface of a conductor. An interlayer laminate may be disposed on the connection bar 5 so as to obtain a shielding effect and also capacitance with a remarkably high distributed parameter. Consequently, a high external noise blocking effect may be obtained, which may allow for generation of stable power.

The connection bar 5 may be formed on one surface of the housing 203. In detail, the connection bar 5 may be integrally formed with the second case 202 or independently formed at the outside of the second case 202.

The connection bar 5 may also be replaced with a shielding cable with a minimized length, other than the bus bar. In this case, the adaptors may also be replaced with shielding connectors or lug-type connectors.

The present disclosure has replaced the power cable with the connection bar 5 in order to minimize a current variation and a voltage variation of circuits due to a switching element, which mainly causes an electromagnetic interference. Here, when the plurality of power conversion devices are connected in parallel, the voltage variation and the current variation have been minimized in a manner of minimizing line impedances by using the connection bar 5 and optimizing input impedances of the power conversion devices connected in parallel by use of an impedance adjusting unit 9.

Figure 6:
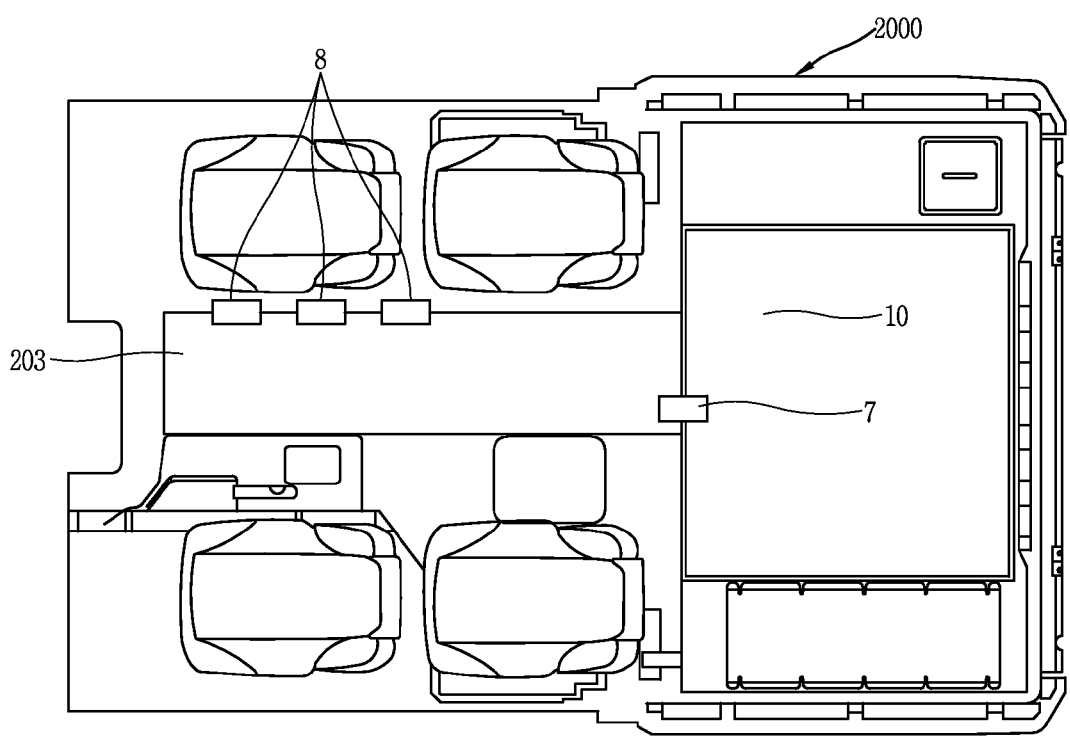
FIG. 6 is an arrangement view illustrating that a housing for shielding electromagnetic noise is mounted in electric vehicle in accordance with one exemplary embodiment disclosed herein.

FIG. 6 is an arrangement view illustrating that the housing 203 for shielding electromagnetic noise is mounted in an electric vehicle 1000 in accordance with one exemplary embodiment disclosed herein.

The battery 10 may be mounted to one side of the vehicle, and the housing 203 may be disposed at a central portion of the vehicle such that power supplied from the battery 10 can be supplied to a motor.

A DC connector 7 and 3-phase AC connectors 8 may be formed on a side surface of the housing 203 in an exposed manner. Each connector may be connected to the battery, the electric generator, the front-wheel motor or the rear-wheel motor.

Figure 7A:
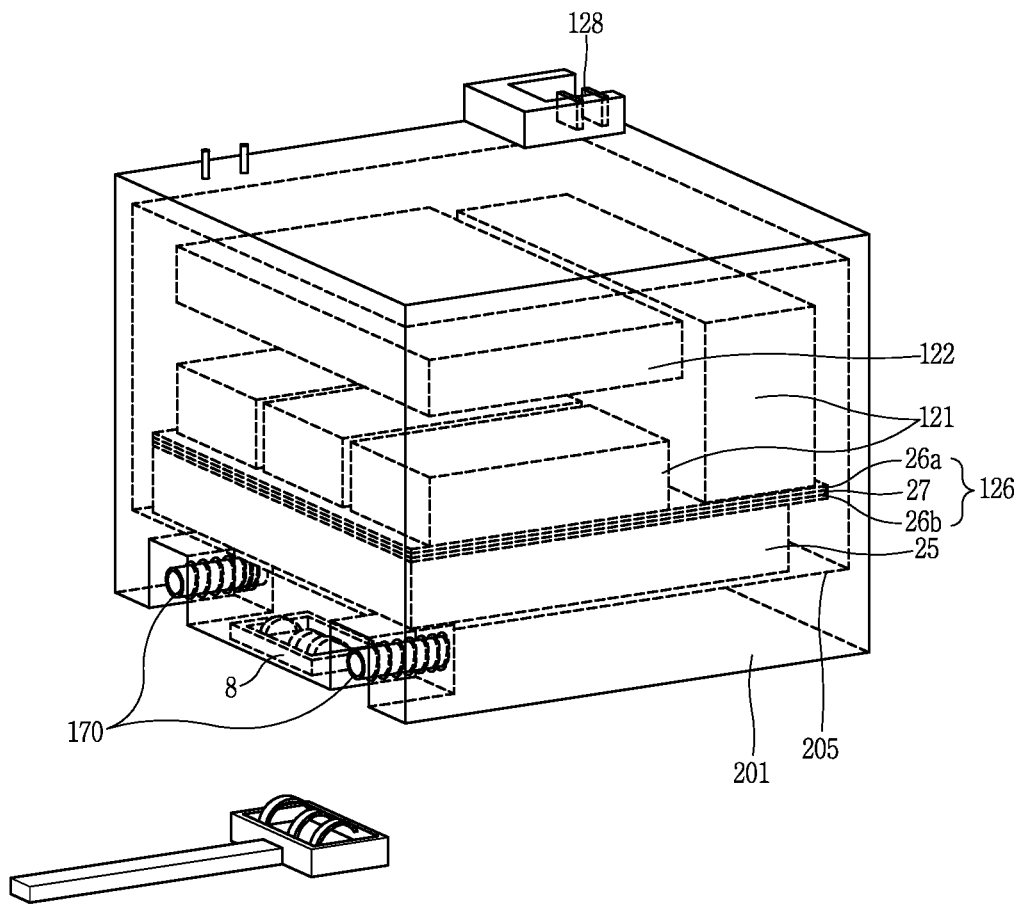
FIG. 7A is an exploded view of power conversion devices disposed in a housing for shielding electromagnetic noise in accordance with one exemplary embodiment disclosed herein.
Figure 7B:
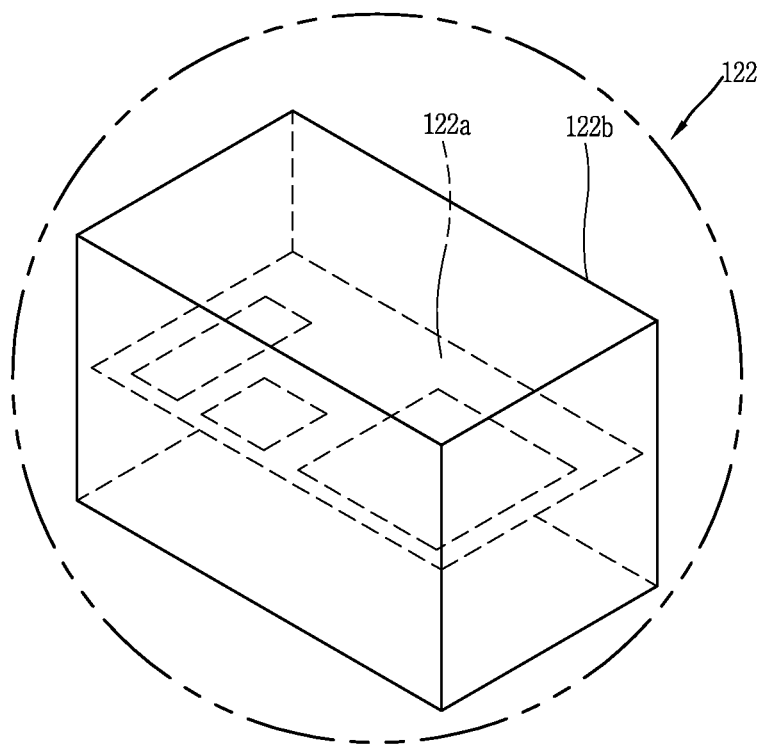
FIGS. 7B and 7C are configuration views of a low-voltage circuit unit and a high-voltage circuit unit, respectively.
Figure 7C:
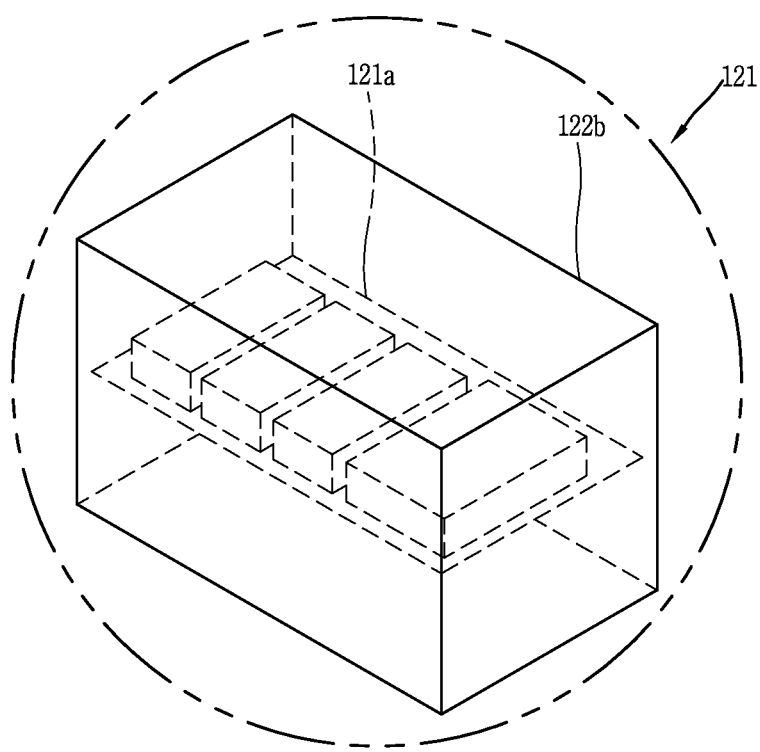

FIG. 7A is an exploded view of the power conversion device disposed in the housing for shielding the electromagnetic noise in accordance with the one exemplary embodiment disclosed herein, and FIGS. 7B and 7C are configuration views of the low-voltage circuit unit and the high-voltage circuit unit, respectively.

As illustrated in FIG. 7A, the high-voltage circuit unit 121 and the low-voltage circuit unit 122 of the power conversion device may be spaced apart from each other within a predetermined inner space 205 of the housing. At least one of the high-voltage circuit unit 121 and the low-voltage circuit unit 122 may be provided in plurality. The high-voltage circuit unit 121 and the low-voltage circuit unit 122 may be arranged in a manner that virtually extending surfaces thereof, as one surface of each of them, are orthogonal to each other. Accordingly, radiation spaces of electromagnetic waves of the high-voltage circuit unit 121 and the low-voltage circuit unit 122 may be orthogonal to each other, thereby attenuating the electromagnetic interference.

One surface of the high-voltage circuit unit 121 may be disposed to be covered with a heat sink 25. The heat plate 25 may be formed to come in contact with the high-voltage circuit unit 121 so as to cool heat transferred from the high-voltage circuit unit 121. An intermediate member 126 may be formed between the heat sink 25 and the high-voltage circuit unit 121. The intermediate member 126 may include a first layer 26a and a second layer 26b which are formed of epoxy resin, and a copperplate 27 interposed between the first and second layers 26a and 26b. An upper surface of the first layer 26a may come in contact with the high-voltage circuit unit 121, and a lower surface of the second layer 26b may come in contact with the first case 201.

Here, when the high-voltage circuit unit 121 is provided with an IGBT as a switching element, an emitter terminal of the IGBT may be connected to the copperplate 27. This may allow for attenuation of conducted noise generated due to parasitic capacitance, which is generated between the IGBT and the copperplate or between the first case 201 and the copperplate.

Figure 8:
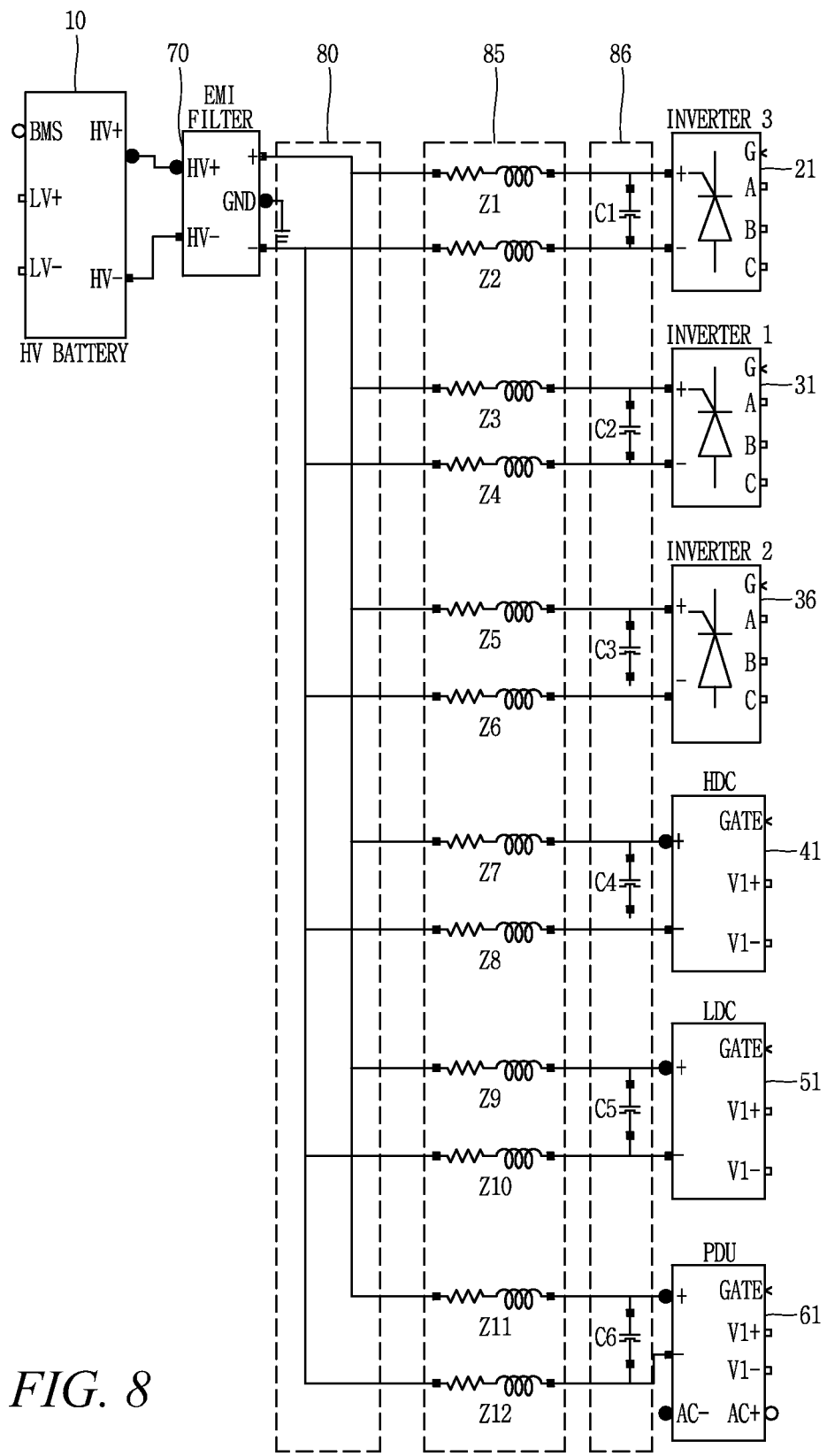
FIG. 8 is a view illustrating a high-voltage DC circuit of an electric propulsion system in accordance with a comparative embodiment.

FIG. 8 is a view illustrating a high-voltage DC circuit of an electric propulsion system 100 in accordance with a comparative embodiment.

As illustrated in FIG. 8, DC cables for interconnecting the DC connecting portion 80 and the power conversion devices may be connected in parallel to cables of the power conversion devices. This may bring about an increase in a voltage variation (dv/dt) and a DC current variation (di/dt) due to equivalent impedances. Here, the reference numeral 85 denotes equivalent impedances of power lines, and 86 denotes input capacitors of the power conversion devices.

Figure 9:
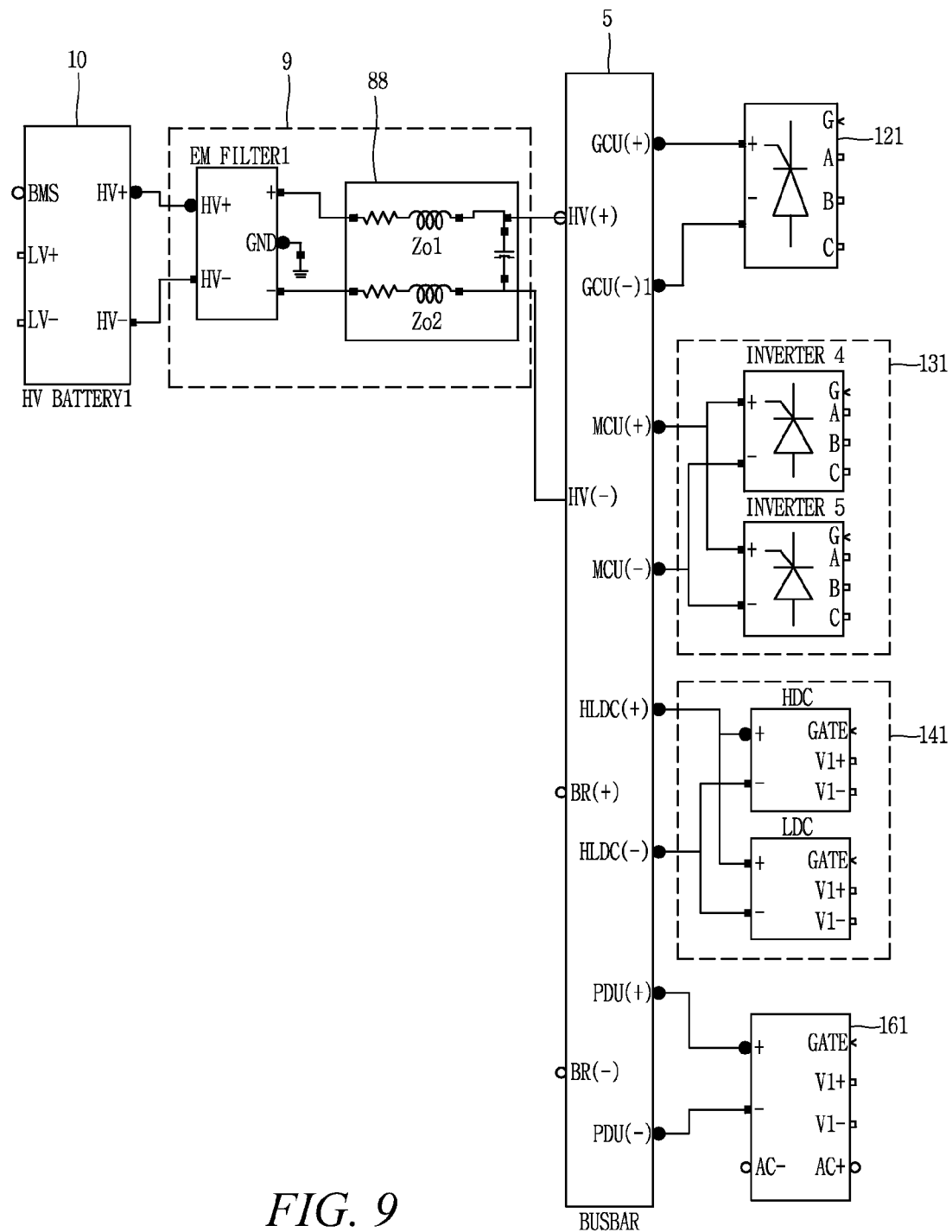
FIG. 9 is a view illustrating a high-voltage DC circuit of an electric propulsion system with a housing for shielding electromagnetic noise in accordance with one exemplary embodiment disclosed herein.

FIG. 9 is a view illustrating a high-voltage DC circuit of an electric propulsion system 2000 having a housing 203 for shielding electromagnetic noise in accordance with one exemplary embodiment disclosed herein.

To reduce the voltage variation (dv/dt) and the DC current variation (di/dt), the DC cables have been replaced with the connection bar 5, and the EMI filter 70, the power line impedances 85 and the input capacitors 86 illustrated in the comparative embodiment have been replaced with the impedance adjusting unit 9. Accordingly, the power line impedance value can be reduced by less than 20% in the exemplary embodiment, and electromagnetic noise propagated through the cables can be reduced.

Here, the battery 10 and the connection bar 5 may be connected to each other through the impedance adjusting unit 9.

Figure 10:
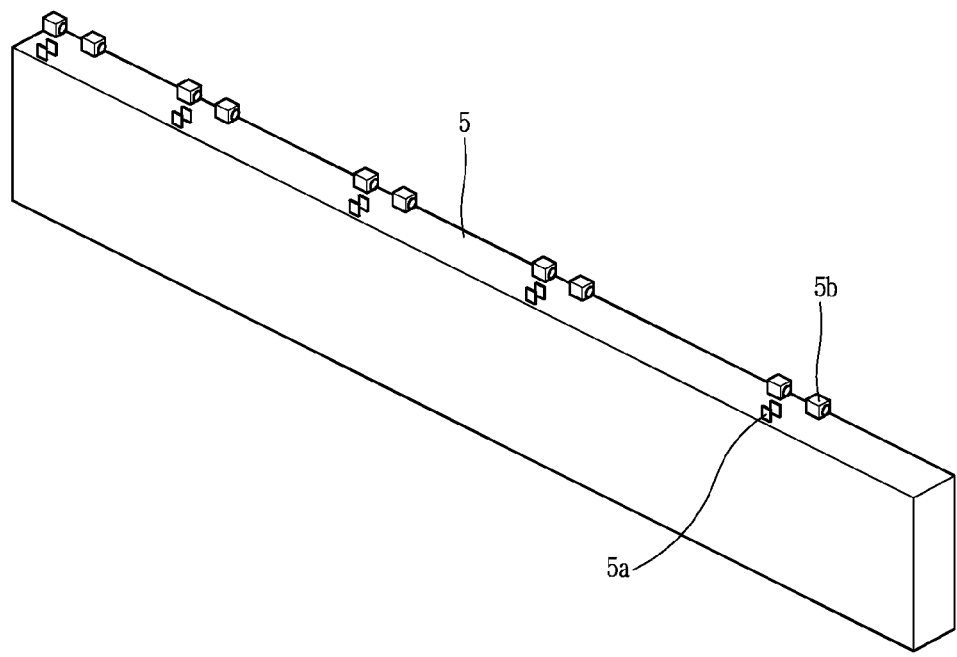
FIG. 10 is a view illustrating a connection bar for shielding electromagnetic noise, applied to a housing for shielding the electromagnetic noise, in accordance with one exemplary embodiment disclosed herein.
Figure 11:
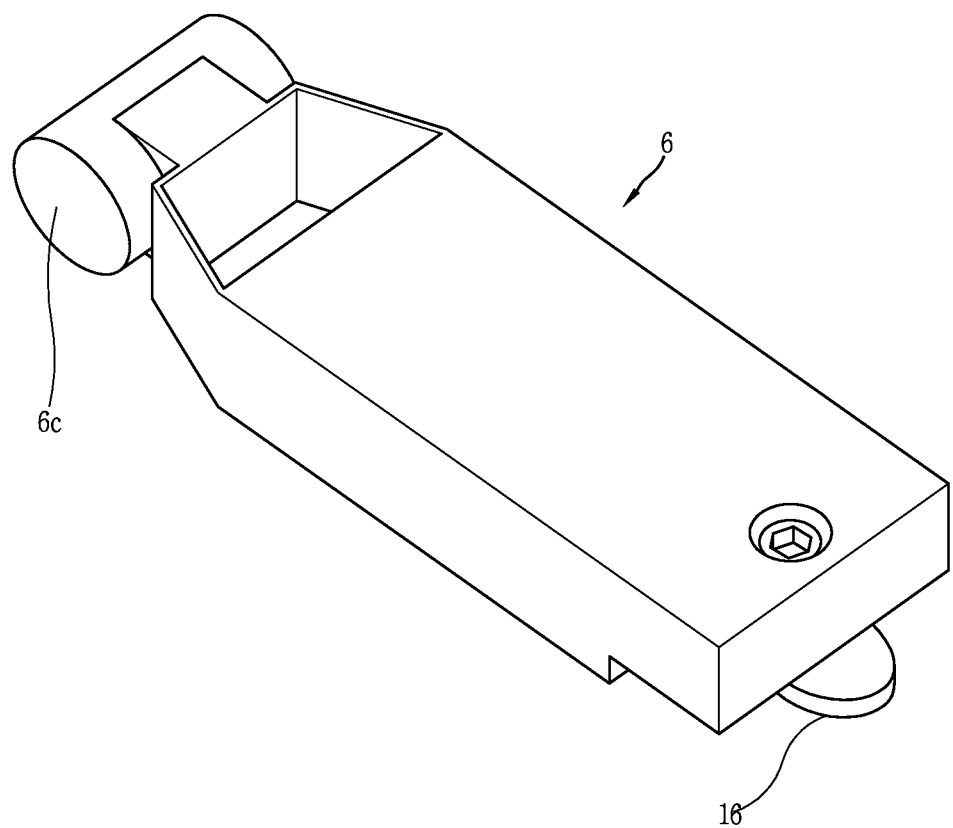
FIG. 11 is a view illustrating an adaptor for shielding noise on a DC connection bar applied to a housing for shielding electromagnetic noise in accordance with one exemplary embodiment disclosed herein.
Figure 12A:
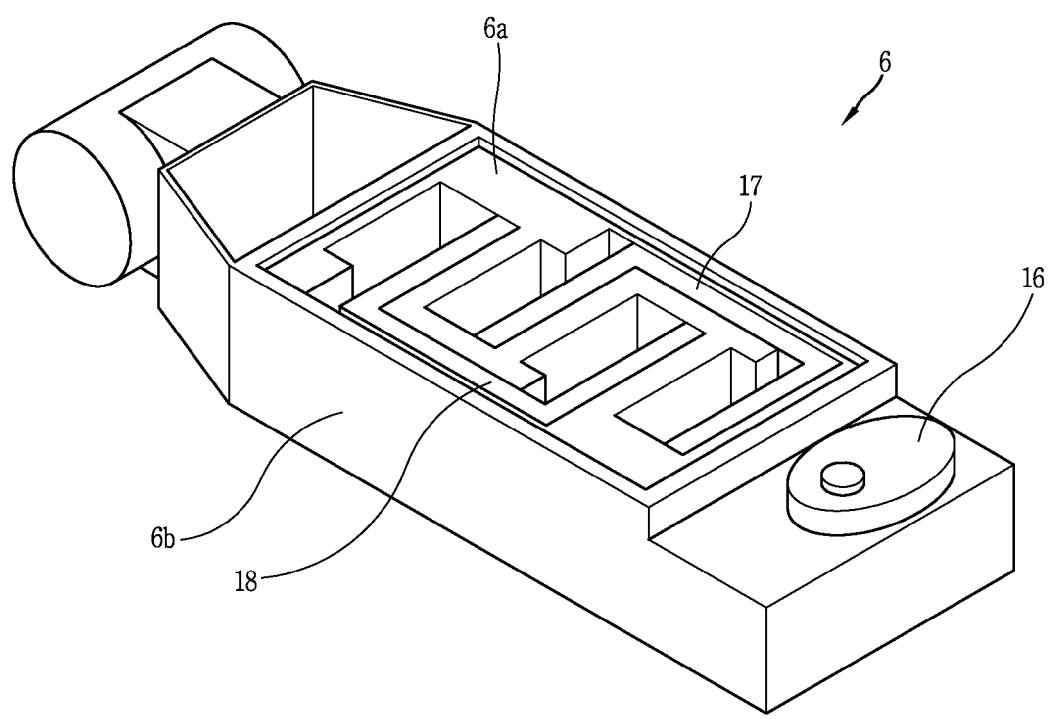
FIG. 12A is a view illustrating an internal structure of an adaptor for shielding noise on a DC connection bar applied to a housing for shielding electromagnetic noise in accordance with one exemplary embodiment disclosed herein.
Figure 12B:
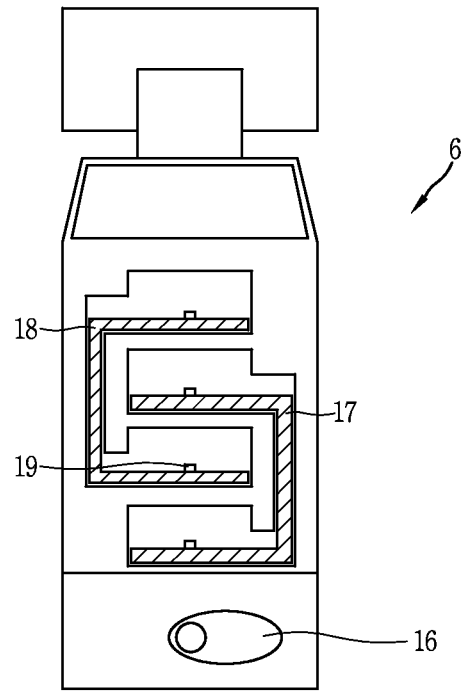
FIG. 12B is a bottom view in an unlock state of the adaptor.
Figure 12C:
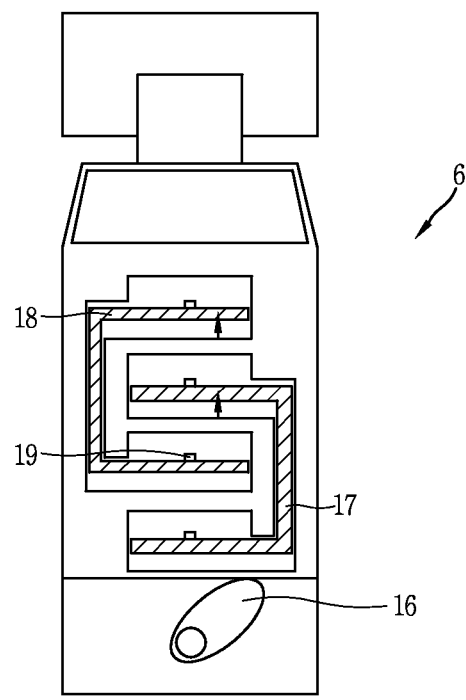
FIG. 12C is a bottom view in a lock state of the adaptor.

FIG. 10 is a view illustrating the connection bar 5 for shielding electromagnetic noise, applied to the housing 203 for shielding the electromagnetic noise, FIG. 11 is a view illustrating the adaptor 6 for shielding the noise on the DC connection bar 5, applied to the housing 203 for shielding the electromagnetic noise, in accordance with the one exemplary embodiment disclosed herein, FIG. 12A is a view illustrating an internal structure of the adaptor for shielding the noise on the DC connection bar, applied to the housing for shielding the electromagnetic noise, in accordance with the one exemplary embodiment disclosed herein, FIG. 12B is a bottom view of the adapter in an unlock state, and FIG. 12C is a bottom view of the adapter in a lock state.

The connection bar 5 may be formed to electrically interconnect the battery and the power conversion devices.

The connection bar 5 and the power conversion devices may be connected to each other by the adapters 6. As illustrated in FIGS. 5 and 10, contact protrusions 5a may protrude from one side of the connection bar 5, and contact portions (electrodes) 128 may also protrude from one side of each of the power conversion devices.

As illustrated in FIG. 11, the adapter 6 may have one side 6c coupled to a hinge 5b of the connection bar 5, and the other side detachably coupled to the electrodes 128 of the power conversion devices. Also, each of the adapters 6 may be inserted into a structure in a concave-convex shape, formed on the connection bar 5, by use of bolts.

As illustrated in FIGS. 5, 11, and 12A to 12C, each of the adapters 6 may be provided with an inner side 6a and an outer side 6b. Conducting members 17 and 18 may formed on the inner side 6a such that the adapter 6 can be electrically connected to the electrodes 128 of the power conversion device when the electrodes 128 are inserted therein. A shielding member for covering the conducting members to shield noise generated from the power conversion device may be formed on the outer side 6b.

As illustrated in FIGS. 12A to 12C, the adapter 6 may be provided with a knob 16 formed to be rotatable. The conducting members 17 and 18 and the electrodes 128 may be contactable or non-contactable with each other in response to the rotation of the knob 16. That is, the conducting members 17 and 18 may be moved in response to the rotation of the knob 16 so as to be contactable with the electrodes 128. Also, in response to the rotation of the knob 16, protrusions 19 may be coupled to or separated from the electrodes 128. Accordingly, the adapter 6 may be detachably coupled to the electrodes 128 of the power conversion device.

Figure 13:
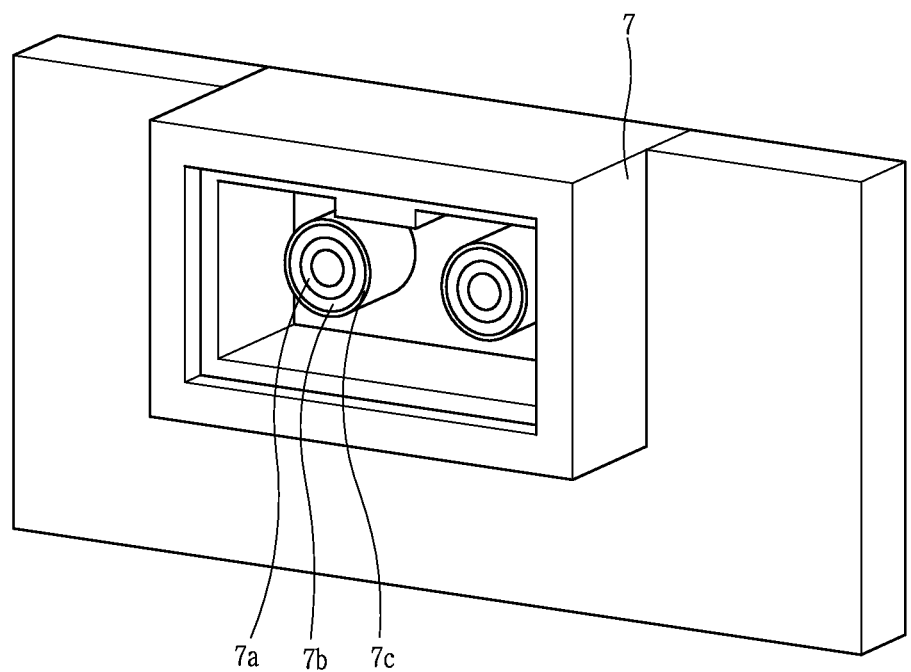
FIG. 13 is a view illustrating a DC shielding connector applied to a housing for shielding electromagnetic noise in accordance with one exemplary embodiment disclosed herein.

FIG. 13 is a view illustrating a DC shielding connector applied to the housing 203 for shielding the electromagnetic noise in accordance with the one exemplary embodiment disclosed herein.

As illustrated in FIGS. 5 and 13, a DC connector 7 may be formed to penetrate through one side of the housing 203 at which the impedance adjusting unit 9 is disposed. The DC connector 7 may include electrode members 7a having electrodes exposed on inner circumferences thereof, insulators 7b covering outer circumferences of the electrode members 7a, and shielding portions 7c covering the insulators 7b. Accordingly, electromagnetic waves can be prevented from being radiated to the outside of the housing 203. The DC connector 7 may shield the inside of the housing 203, together with the housing 203.

Figure 14:
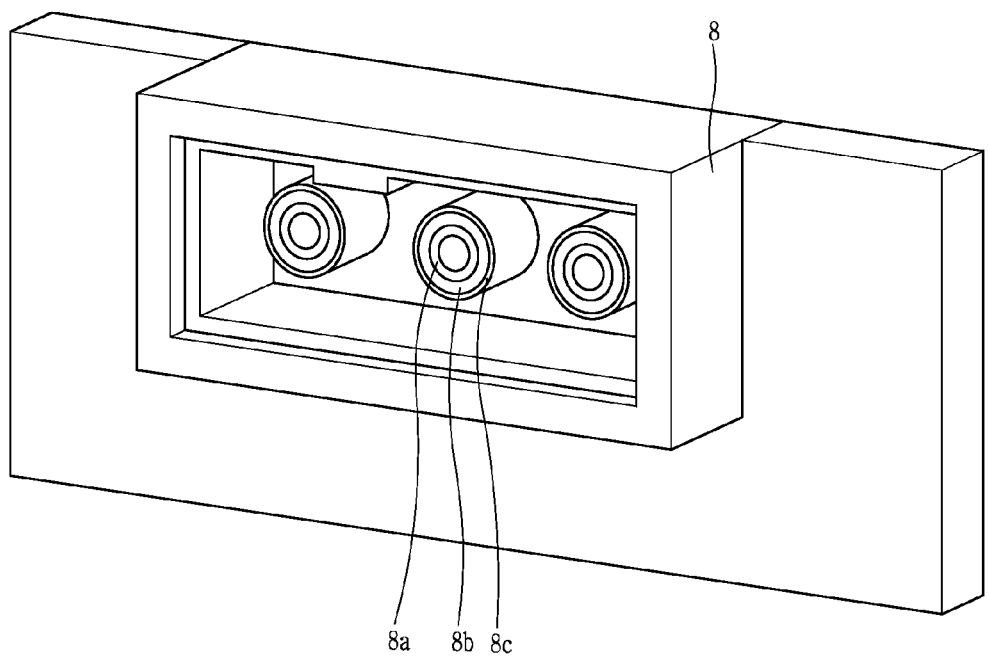
FIG. 14 is a view illustrating a 3-phase AC shielding connector applied to a housing for shielding electromagnetic noise in accordance with one exemplary embodiment disclosed herein.

FIG. 14 is a view illustrating the 3-phase AC shielding connector applied to the housing 203 for shielding the electromagnetic noise in accordance with the one exemplary embodiment disclosed herein.

As illustrated in FIGS. 5 and 14, the 3-phase AC connectors 8 may be formed to penetrate through one side of the housing 203 at which the power conversion devices having an inverter are disposed.

Each of the 3-phase AC connectors 8 may include electrode members 8a having electrodes having electrodes exposed on inner circumferences thereof, insulators 8b covering outer circumferences of the electrode members 8a, and shielding portions 8c covering the insulators 8b. Accordingly, electromagnetic waves can be prevented from being radiated to the outside of the housing 203. The 3-phase AC connector 8 may shield the inside of the housing 203, together with the housing 203.

Unlike this, although not illustrated, a connector connected portion may be replaced with a log connection, other than the DC connector and the 3-phase AC connector. Here, there may be further provided a conductor case formed to be aligned with a size of a cable and a connected portion for shielding the cable and the log-connected portion, and shielding portions each having a hole formed on one surface thereof for bolt-coupling of a lug cable upon mounting the conductor case, and a shielding cover for shielding the hole.

Figure 15:
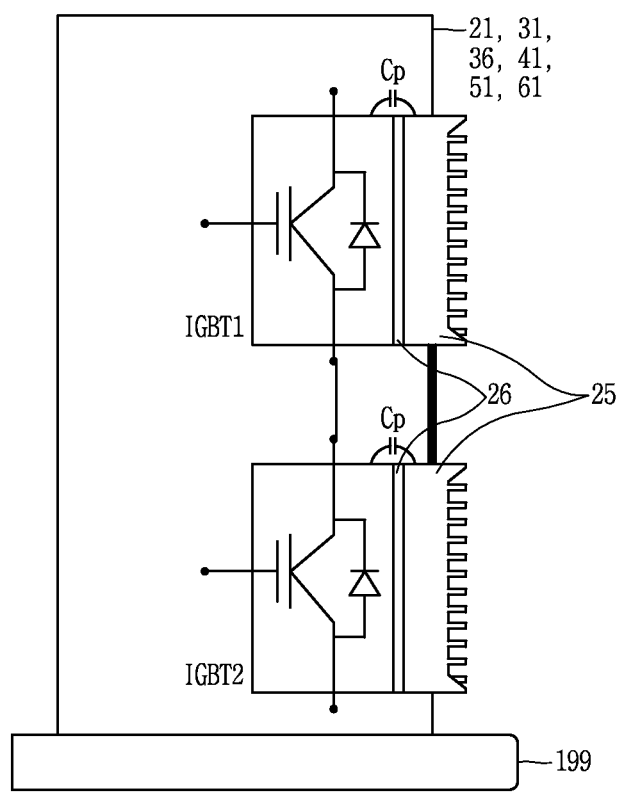
FIG. 15 is a conceptual view illustrating that an IGBT applied to a high-power conversion device according to a comparative embodiment is mounted to a heat sink.
Figure 16:
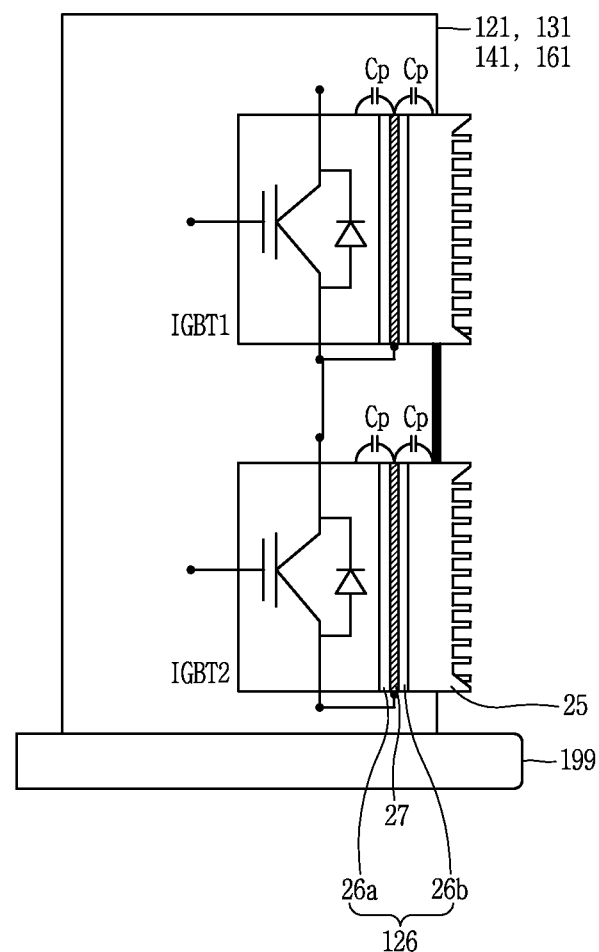
FIG. 16 is a conceptual view illustrating an IGBT applied to a housing for shielding electromagnetic noise according to one exemplary embodiment is mounted to a heat sink.

FIG. 15 is a conceptual view illustrating that an IGBT applied to the high-power conversion device is mounted to a heat sink in accordance with the comparative embodiment, and FIG. 16 is a conceptual view illustrating an IGBT applied to the housing 203 for shielding the electromagnetic noise is mounted to a heat sink in accordance with the one exemplary embodiment.

As illustrated in FIG. 15, one surface of the high-voltage circuit unit 21, 31, 41, 51, 61 may be disposed to be covered with the heat sink 25. The heat sink may come in contact with the high-voltage circuit unit to cool heat transferred from the high-voltage circuit unit.

A thermal grease 26 may be formed between the heat sink and the high-voltage circuit unit. Here, the high-voltage circuit unit may include an IGBT as a switching element. Accordingly, a parasitic capacitance Cp may be formed between the heat sink and the IGBT at a high-frequency band. The thusly-formed parasitic capacitance Cp may form a path along which a current is leaked to a ground 199 of the electric vehicle 1000, thereby generating electromagnetic noise.

Referring to FIG. 16, the heat sink according to the exemplary embodiment disclosed herein may include the first and second layers formed of epoxy resin, and the copperplate formed between the first and second layers. The upper surface of the first layer may be formed to come in contact with the high-voltage circuit unit 121, 131, 141, 161, and the lower surface of the second layer may be formed to come in contact with the first case 201.

Here, when the high-voltage circuit unit is provided with the IGBT as the switching element, the emitter terminal of the IGBT may be connected to the copperplate 27. This may allow for attenuation of conducted noise generated due to the parasitic capacitance, which is generated between the IGBT and the copperplate or between the first case 201 and the copperplate.

Figure 17:
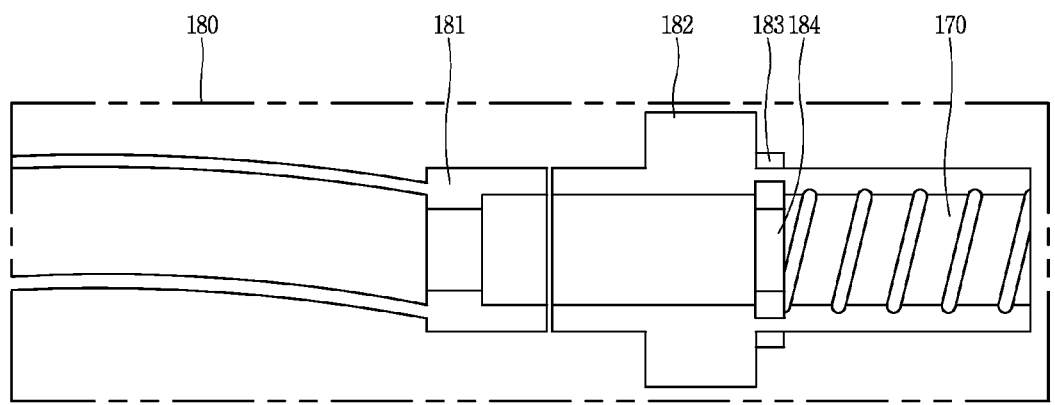
FIG. 17 is a view illustrating one example of a cooling pipe applied to a housing for shielding electromagnetic noise in accordance with one exemplary embodiment disclosed herein.

FIG. 17 is a view illustrating one example of a cooling pipe applied to the housing for shielding the electromagnetic noise in accordance with the one exemplary embodiment disclosed herein.

As illustrated in FIGS. 5, 7 and 17, a pipe connecting portion 170 may be formed through the housing 203 to supply cooling fluid into the space 205 of the housing 203. A pipe connector 180 coupled to the pipe connecting portion 170 may be formed to shield a hole of the housing 203 having the pipe connecting portion.

The pipe connector 180 may include a rotating portion 182 formed to be rotatable with respect to a pipe fixing portion 181 and coupled to the pipe connecting portion 170, a sealing portion 184 for preventing a leakage of cooling fluid, and a shielding portion 183 for shielding the hole for blocking electromagnetic noise.

Figure 18:
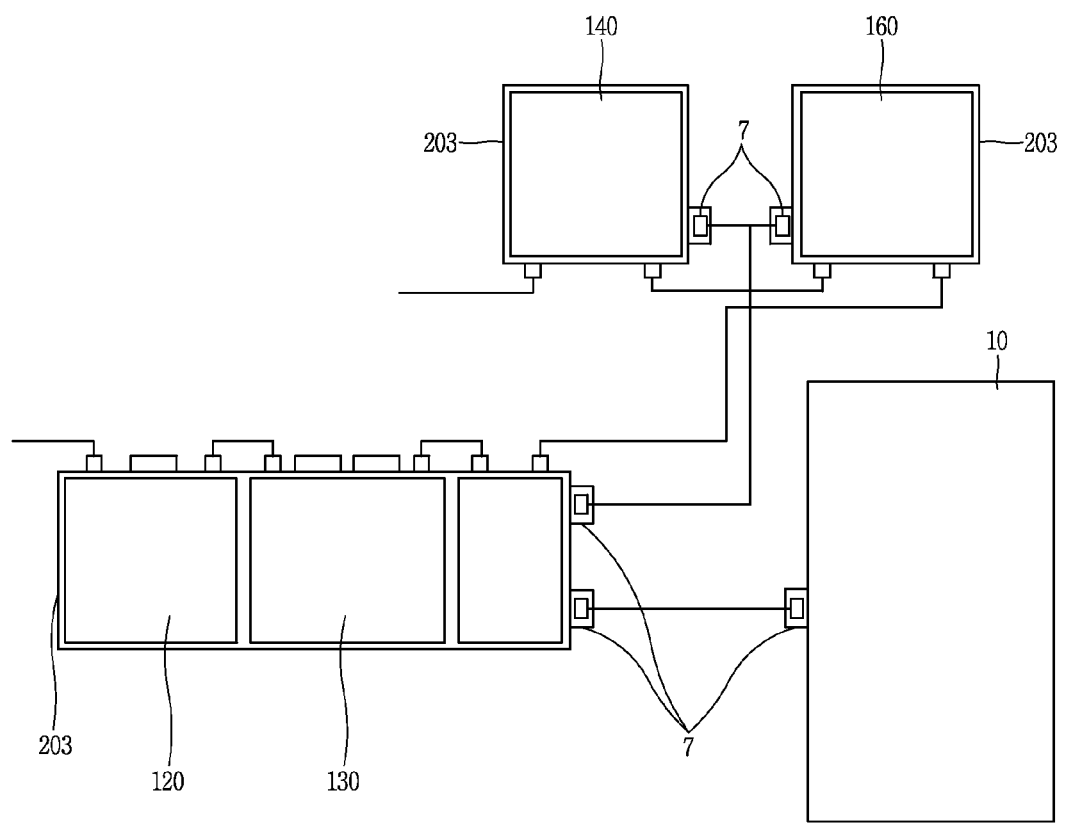
FIG. 18 is a view illustrating one example that a power conversion devices are disposed in the electric vehicle having a housing for shielding electromagnetic noise in accordance with one exemplary embodiment disclosed herein.

FIG. 18 is a view illustrating one example that the power conversion devices are disposed in the electric vehicle having the housing for shielding the electromagnetic noise in accordance with the one exemplary embodiment disclosed herein.

The housings 203 may be separated from each other. As illustrated in FIG. 18, the generator inverter and the motor inverter may be integrally disposed in one integrated housing 203 which has an at least double-shielding structure, and each of the DC converter and the power distributor may be disposed in another housing 203 having a double-shielding structure.

The configuration and method of the aforementioned embodiments may not be applied to the electric propulsion system for the electric vehicle in a limiting manner, but those embodiments may be configured by selective combination of all or part of each embodiment so as to implement different variations.

What is claimed is:
1. An electric propulsion system of an electric vehicle comprising:
a housing having an inside partitioned into a plurality of spaces;
power conversion devices disposed in the partitioned spaces of the housing, respectively;
a connection bar formed on one surface of the housing to electrically interconnect the power conversion devices and a battery; and
adapters configured to connect the connection bar to the power conversion devices,
wherein each of the adaptors comprises an inner side and an outer side,
wherein the inner side of the adaptor is provided with conductor members formed to be electrically connected to electrodes of the power conversion devices when the electrodes are inserted therein,
wherein the outer side of the adaptor is provided with shielding members covering the conductor members for shielding noise generated from the power conversion devices, wherein each of the power conversion devices comprises a high-voltage circuit unit and a low-voltage circuit unit, and wherein the high-voltage circuit unit and the low-voltage circuit unit are formed to be covered with shielding cases, respectively, and spaced from each other within each space.

2. The system of claim 1, wherein each of the adaptors has one side coupled to the connection bar, and the other side detachably coupled to the electrodes of the power conversion devices.

3. The system of claim 2, wherein each of the adaptors comprises a knob formed to be rotatable, and wherein the conductor members and the electrodes come in contact with each other or are separated from each other in response to a rotation of the knob.

4. The system of claim 1, further comprising a heat sink covering one surface of the high-voltage circuit unit, wherein the high-voltage circuit unit comprises an insulated gate bipolar transistor (IGBT) as a switching element, and wherein an emitter terminal of the IGBT is connected to a copperplate formed between the IGBT and the heat sink.

5. The system of claim 4, wherein one surface of the high-voltage circuit unit and one surface of the low-voltage circuit unit are orthogonal to each other.

6. The system of claim 4, wherein a pipe connecting portion is formed through the housing to supply cooling fluid into an inner space of the housing, and wherein a pipe connector coupled to the pipe connecting portion shields a hole of the housing having the pipe connecting portion.

7. The system of claim 1, wherein the battery and the connection bar are connected to each other with interposing an impedance adjusting unit therebetween, the impedance adjusting unit adjusting input impedances of the power conversion devices, wherein a direct-current (DC) connector is formed through one side of the housing having the impedance adjusting unit, wherein the DC connector comprises:

electrode members having electrodes exposed on inner circumferences thereof;

insulators covering outer circumferences of the electrode members; and shielding portions shielding the insulators.

8. The system of claim 1, wherein a three-phase alternating-current (AC) connector is formed through one side of the housing having the power conversion device with an inverter, and wherein the three-phase AC connector comprises:

electrode members having electrodes exposed on inner circumferences thereof;

insulators covering outer circumferences of the electrode members; and shielding portions shielding the insulators.

9. The system of claim 1, wherein the housing comprises:

first cases covering the power conversion devices, respectively; and a second case covering the first cases, wherein the connection bar is integrally formed with the second case.

* * * * *